(12) United States Patent
Lee et al.

(10) Patent No.: US 6,531,374 B2
(45) Date of Patent: Mar. 11, 2003

(54) OVERLAY SHIFT CORRECTION FOR THE DEPOSITION OF EPITAXIAL SILICON LAYER AND POST-EPITAXIAL SILICON LAYERS IN A SEMICONDUCTOR DEVICE

(75) Inventors: Kun-I Lee, Sanchung (TW); Tai-Yuan Wu, Taipei (TW); Ren-Jyh Leu, Taipei (TW); Hung-Chih Chen, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/927,958

(22) Filed: Aug. 10, 2001

(65) Prior Publication Data

US 2003/0032256 A1 Feb. 13, 2003

(51) Int. Cl.[7] .................................................. H01L 21/76
(52) U.S. Cl. ....................... 438/401; 438/462; 257/622; 257/797
(58) Field of Search ................................. 438/401, 402, 438/403, 462, 478–9; 257/797, 622

(56) References Cited

U.S. PATENT DOCUMENTS 6,358,814 B1 * 3/2002 Harada ........................ 438/401

* cited by examiner

Primary Examiner—David Nelms
Assistant Examiner—D Le
(74) Attorney, Agent, or Firm—Tung & Associates (57) ABSTRACT

Correction of overlay shift of an epitaxial silicon layer deposited on a semiconductor wafer, and of post-epitaxial silicon layers subsequently deposited, is disclosed. When an epitaxial silicon layer of a given thickness is deposited, the zero mark coordinates for the deposition are shifted relative to alignment marks on the wafer by a distance based on the thickness of the layer. The distance is preferably proportional to the thickness of the epi layer. This prevents overlay shift of the epi layer. For post-epitaxial silicon layers subsequently deposited, preferably except for the first post-epi layer, a clear out process is initially performed to maintain the alignment marks on the semiconductor wafer. In this way, overlay shift, or misalignment, of the post-epi layers is also prevented.

14 Claims, 10 Drawing Sheets

FIG 1A

PRIOR ART

FIG 1B

PRIOR ART

FIG 2

PRIOR ART

FIG 3

PRIOR ART

PRIOR ART

OVERLAY SHIFT CORRECTION FOR THE DEPOSITION OF EPITAXIAL SILICON LAYER AND POST-EPITAXIAL SILICON LAYERS IN A SEMICONDUCTOR DEVICE

FIELD OF THE INVENTION

This invention relates generally to the deposition of epitaxial silicon layers in semiconductor processing, and particularly to the deposition of further layers on top of such epitaxial silicon layers.

BACKGROUND OF THE INVENTION

Figure 1A:
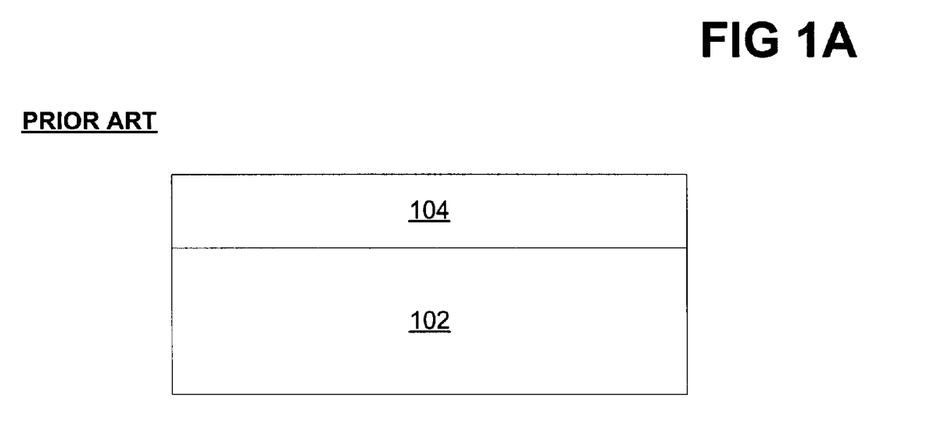
FIGS. 1A and 1B are diagrams showing the effect of patterning on a layer deposited on a semiconductor wafer.
Figure 1B:
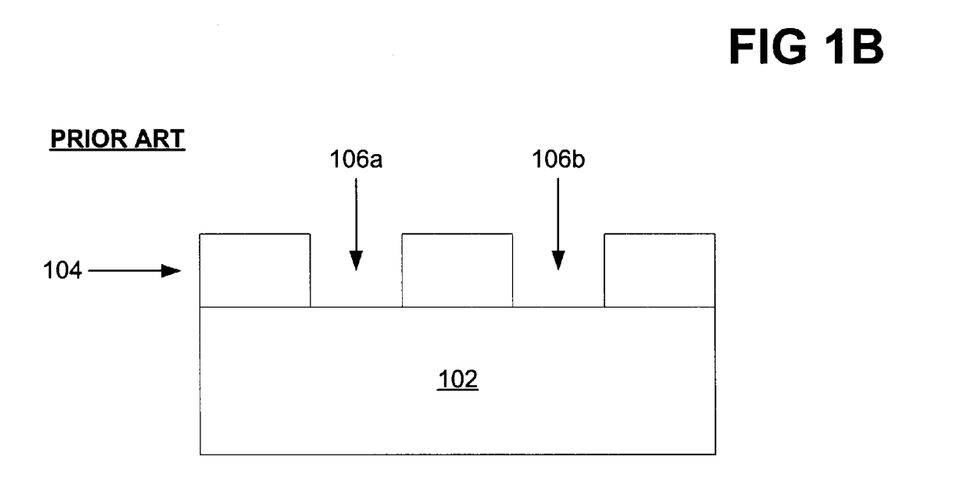

Patterning is one of the basic steps performed in semiconductor processing. It also referred to as photolithography, masking, oxide or metal removal, and microlithography. Patterning enables the selective removal of material deposited on a semiconductor substrate, or wafer, as a result of a deposition process. For example, as shown in FIG. 1A, a layer 104 has been deposited on a substrate 102. After the photolithography process is performed, as shown in FIG. 1B, some parts of the layer 104 have been selectively removed, such that gaps 106a and 106b are present within the layer 104. A photomask, or pattern, is used (not shown in FIG. 1B) so that only the material from the gaps 106a and 106b are removed, and not the other portions of the layer 104. The process of adding layers and removing selective parts of them, in conjunction with other processes, permits the fabrication of semiconductor devices.

Figure 2:
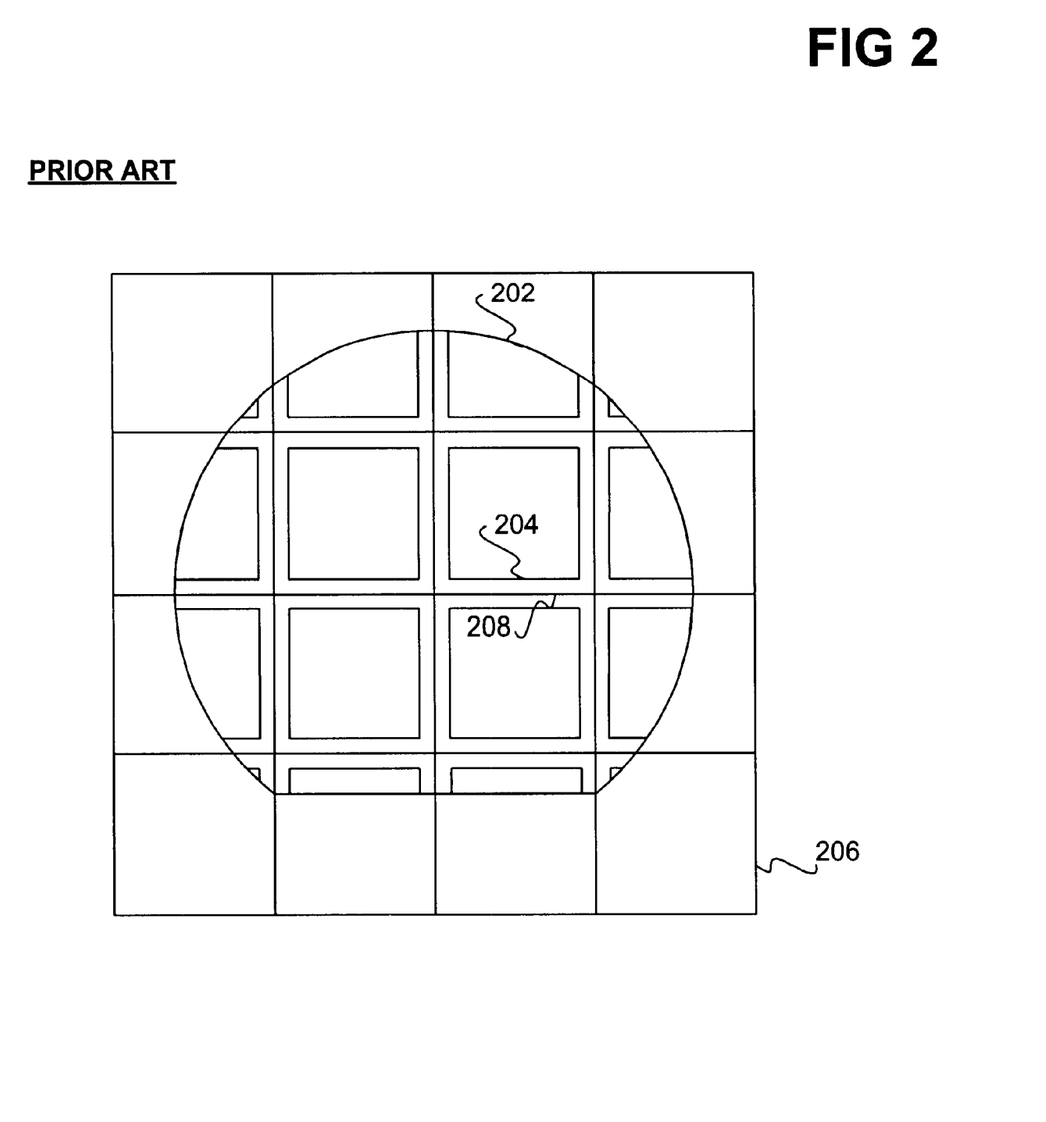
FIG. 2 is a diagram showing the alignment of a mask to a semiconductor wafer.

Alignment is critical in photolithography and deposition, as well as in other semiconductor processes. If layers are not deposited properly, or if they are not selectively removed properly, the resulting semiconductor devices may not function, relegating them to scrap, which can be costly. Therefore, alignment marks are placed on the semiconductor wafer for the photomask used in photolithography to be correctly positioned thereover. This is shown in FIG. 2, where the semiconductor wafer 202 has alignment marks, such as the alignment square 204, thereon. When the photomask 206 is positioned over the wafer 202, its own alignment marks, such as the alignment square 208, is aligned with the alignment marks of the wafer 202. For example, the alignment square 208 of the photomask 206 is aligned so that the alignment square 204 of the wafer 202 is centered therein.

The use of a mask in photolithography and deposition presumes that more than one semiconductor device is processed at a time. That is, using a mask means that all, or a substantial portion, of the semiconductor wafer, with its constituent semiconductor device areas, is processed at a time. In other instances, however, processing in general, and photolithography and deposition in particular, is performed on a device-by-device basis on the wafer.

Figure 3:
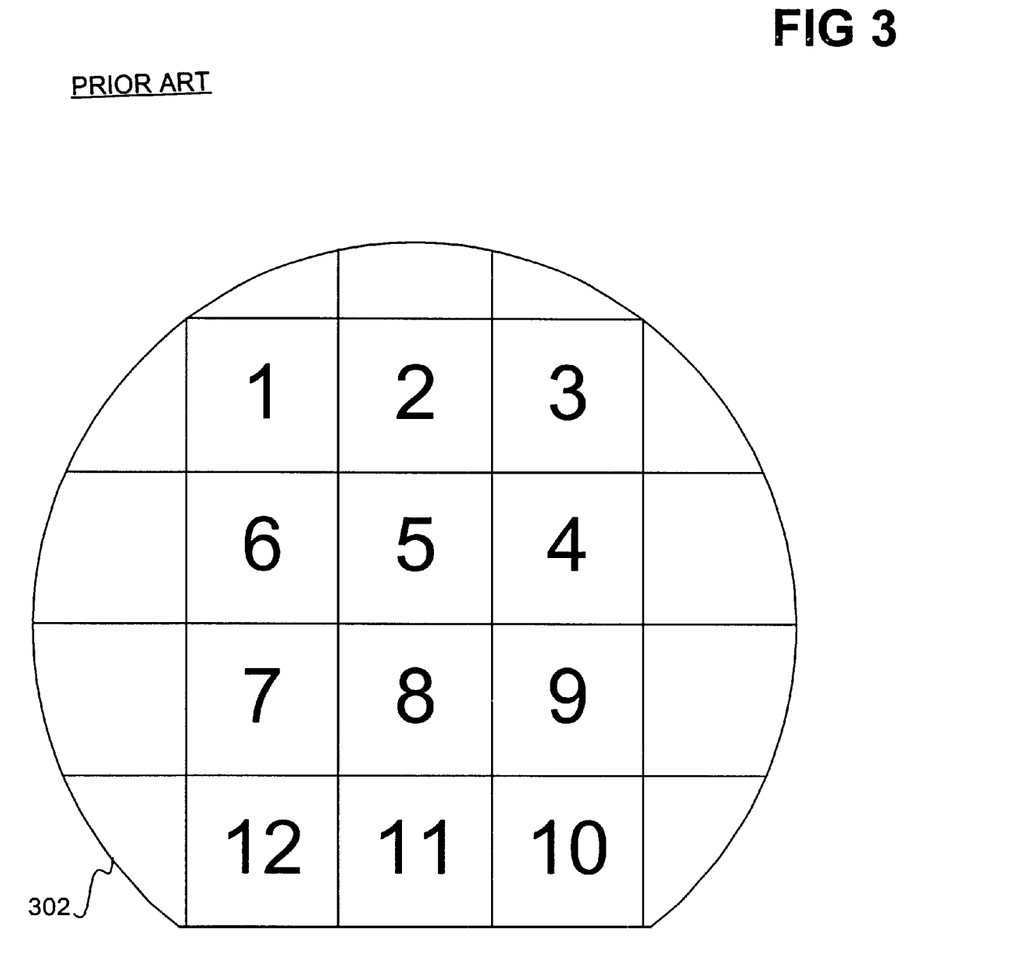
FIG. 3 is a diagram showing an example order in which a stepper can process the semiconductor devices of a semiconductor wafer.

This is accomplished with equipment called a stepper, which steps from one device to another on the semiconductor wafer, performing the same processing step on each device. For example, as shown in FIG. 3, processing may be performed by a stepper on the wafer 302 first relative to device 1, then to device 2, and so on, until device 12 is reached. Rather than using a mask, a stepper uses a reticle, which is a mask for only a portion, such as a single device, of a wafer. Alignment is especially critical when using a stepper, because each time the stepper steps to a new device, the reticle must be properly aligned with the underlying device.

While many different types of materials can be deposited on silicon wafers, one type of material that is frequently deposited is epitaxial silicon, or "epi." Epitaxial, or "epi," silicon layers frequently need to be deposited on the substrate before other layers of other materials are deposited. Epitaxial silicon is a single crystalline structure of film, which comes about when silicon atoms are deposited on a bare silicon wafer in a chemical vapor deposition (CVD) reactor. The use of epitaxial silicon allows for the fabrication of different types of semiconductor devices.

Figure 4:
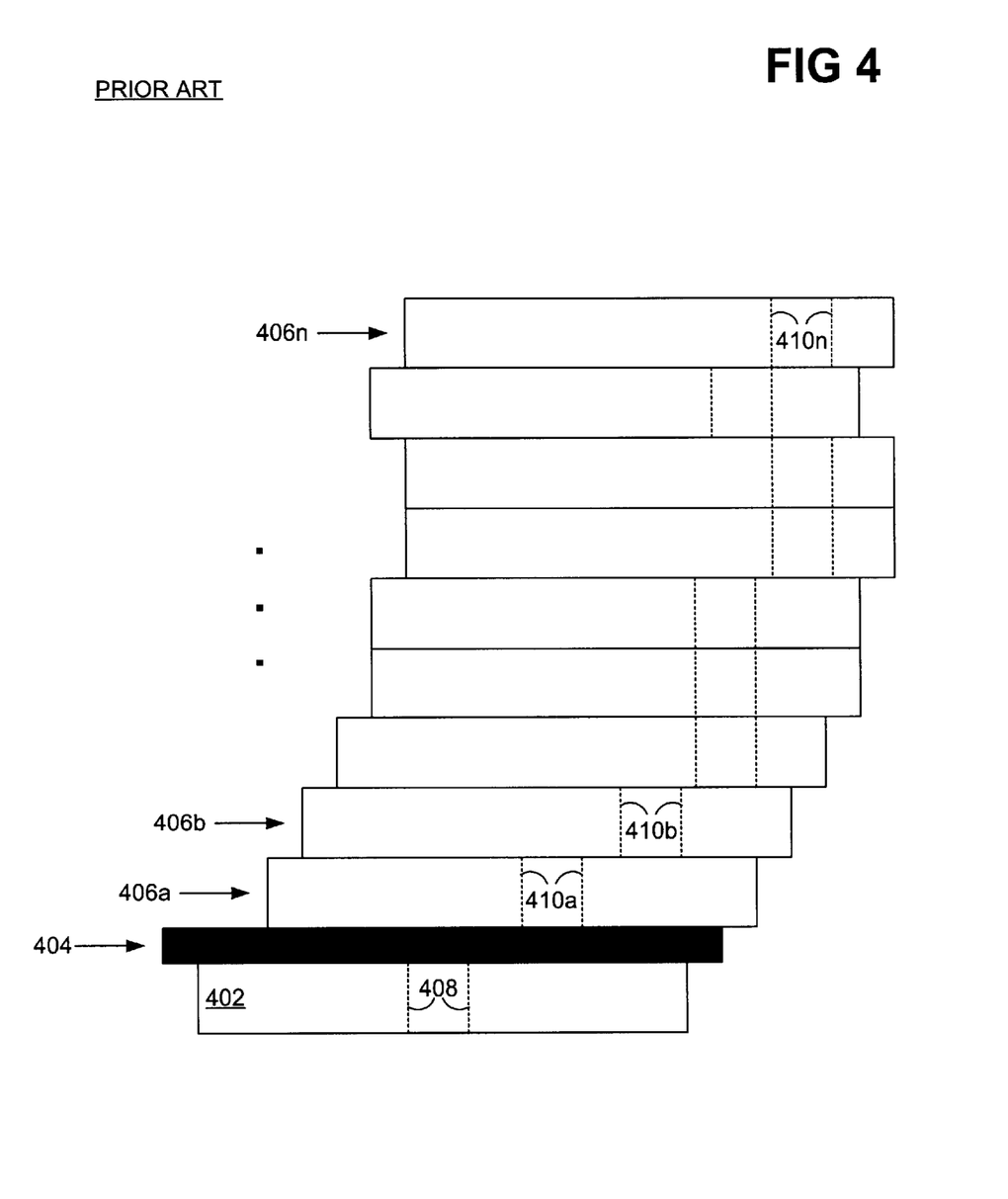
FIG. 4 is a diagram showing the overlay shift that results when depositing subsequent layers on an epitaxial silicon layer deposited on a semiconductor wafer.

However, deposition of an epi silicon layer frequently obscures the underlying alignment marks on the silicon wafer, which can mean that the epi layer itself, as well as the subsequent layers, become misaligned. Misalignment is also referred to as overlay shift. This is shown in FIG. 4. The epi layer 404 may or may not be deposited in a properly aligned configuration on the substrate 402. However, because the epi layer 404 obfuscates alignment marks 408 on the substrate 402, subsequent deposition layers 406a, 406b, . . . , 406n are misaligned. This is indicated by the reference marks 410a, 410b, . . . , 410n, which are shown in FIG. 4 for illustrative clarity only. The reference marks 410a, 410b, . . . , 410n, should substantially align over the alignment marks 408 of the substrate 402, but they do not.

Misalignment is a serious problem, especially in the fabrication of image sensor integrated circuits (IC's), and mixed signal IC's, the latter which may result from either bipolar or bipolar complementary metal oxide semiconductor (BiCMOS) processing. The semiconductor engineer or technician responsible for the fabrication may have to manually align post-epi layers to ensure that overlay shift does not occur. This is a time-intensive, and therefore costly, undertaking, and still results in significant semiconductor wafer scrap. Wafer scrap can sometimes be reused, but often is discarded, resulting in added costs incurred by the semiconductor foundry. Furthermore, where the foundry customer requests a new mask to be used for one or more of the layers, the engineer or technician must expend even more effort to ensure that overlay shift does not occur.

A solution to this problem is to add alignment marks to the first post-epi layer deposited. However, this adds an extra process step to the device fabrication process, and therefore is disadvantageous because it adds cost and time to fabrication. Therefore, there is a need for preventing overlay shift, or misalignment, of epitaxial silicon layers and post-epitaxial silicon layers deposited on a semiconductor substrate. There is a need for such misalignment correction without resulting in significant wafer scrap, and without requiring significant effort by the engineer or technician to perform the correction. There is also a need for overlay shift correction without having to add alignment marks to post-epi deposition layers. For these and other reasons, there is a need for the present invention.

SUMMARY OF THE INVENTION

The invention relates to correcting overlay shift of an epitaxial silicon layer deposited on a semiconductor wafer, and of post-epitaxial silicon layers subsequently deposited. When an epitaxial silicon layer of a given thickness is deposited, the zero mark coordinates for the deposition are shifted relative to alignment marks on the wafer by a distance based on the thickness of the layer. The distance is preferably proportional to the thickness of the epi layer. This prevents overlay shift of the epi layer. For post-epitaxial silicon layers subsequently deposited, preferably except for the first post-epi layer, a clear out process is initially performed to maintain the alignment marks on the semiconductor wafer. In this way, overlay shift, or misalignment, of the post-epi layers is also prevented.

The invention provides for advantages over the prior art. Wafer scrap is significantly reduced, because the invention corrects overlay shift, or misalignment, of the epitaxial silicon layer and subsequently deposited layers. The invention is performed without significant effort expended by the semiconductor engineer or technician to perform the correction. Preferably, for instance, the zero mark coordinates shift of the epitaxial silicon layer deposition, and the clear out process performed prior to subsequent deposition of post-epi layers, can be programmed in the stepper job file of the stepper performing the operation. This programming can be accomplished without requiring an extra processing step for the stepper to perform. The invention also does not require the addition of alignment marks to the post-epi layers to prevent overlay shift, as is required by the prior art.

Still other embodiments, aspects, and advantages of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 5:
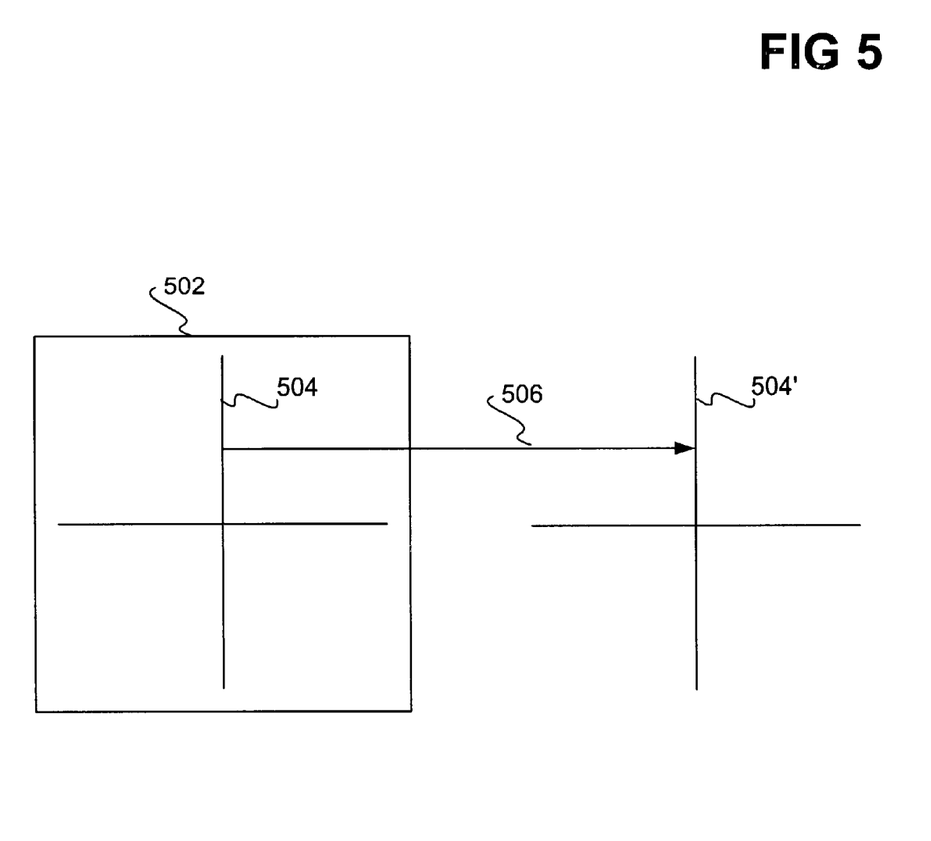
FIG. 5 is a diagram showing how the zero coordinates for deposition of the epitaxial silicon layer are shifted relative to the alignment marks of the semiconductor wafer to prevent misaligmnent.

FIG. 5 shows how the zero coordinates for deposition of the epitaxial silicon layer are shifted relative to the alignment marks of the semiconductor wafer to prevent overlay shift, or misalignment. The epi layer is also referred to as an epi film. The zero coordinates 504 of the epi layer specify where the epi layer is to be deposited relative to the alignment marks 502. Normally, they would be aligned relative to the alignment marks 502 of the semiconductor wafer, as is shown. However, to prevent overlay shift in the x direction, the zero coordinates 504 are instead shifted to the position 504', as indicated by the arrow 506. The distance by which the coordinates are shifted is based on, and preferably proportional to, the thickness of the epitaxial silicon layer to be deposited.

Figure 6A:
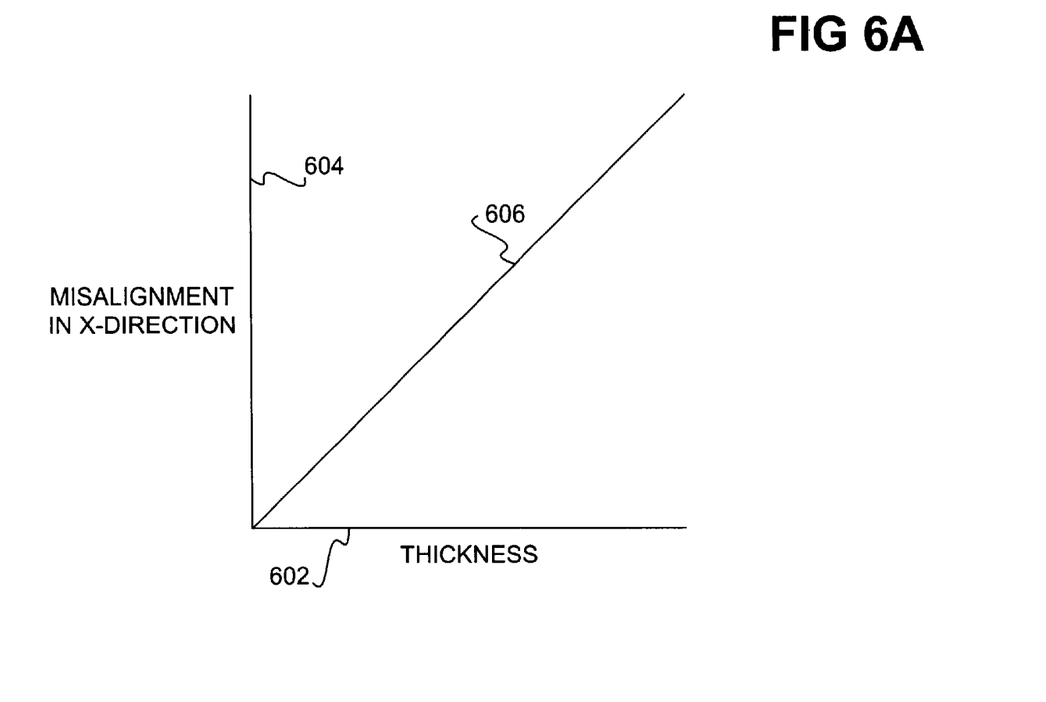
FIGS. 6A and 6B are graphs that show the novel discovery that epi layer shift in the x direction is proportional to layer thickness, and the overlay shift correction that is required to prevent this shift, respectively.
Figure 6B:
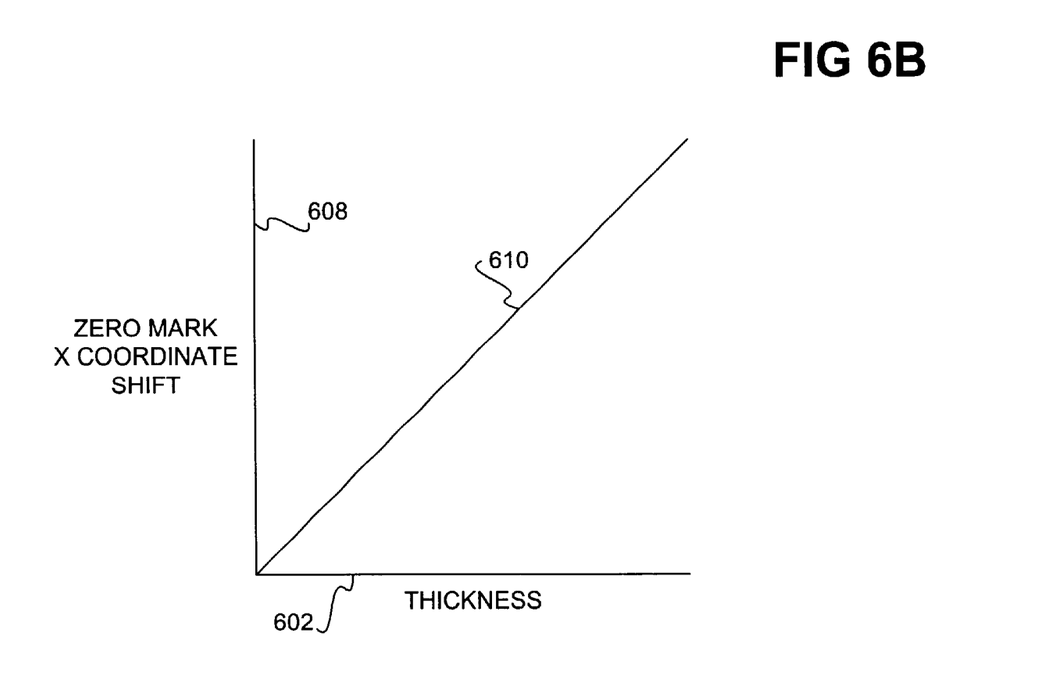

This results from the novel discovery that the misalignment in the x direction of the epi layer is proportional to the thickness of the layer as deposited. This is shown in the graph of FIG. 6A, in which the x-axis 602 represents epi layer thickness, and the y-axis 604 represents misalignment of the epi layer in the x direction. The line 606 shows that the misalignment in the x direction of the epi layer is proportional to the thickness of the layer as deposited. Therefore, as shown in the graph of FIG. 6B, the zero mark x coordinate represented by the y-axis 608 is shifted based on the epi layer thickness represented by the x-axis 602, according to the line 610. This shift preferably is programmed in the job file of the stepper, such that little or no attention is required from the semiconductor engineer or technician overseeing the process.

Figure 7A:
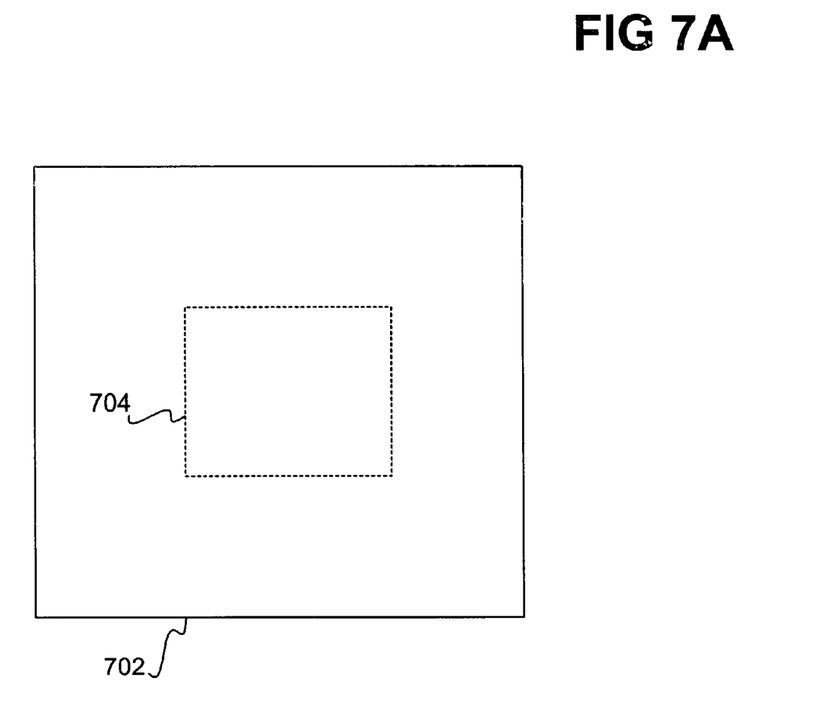
FIGS. 7A and 7B are diagrams showing how the invention corrects misalignment of deposited post-epi layers.
Figure 7B:
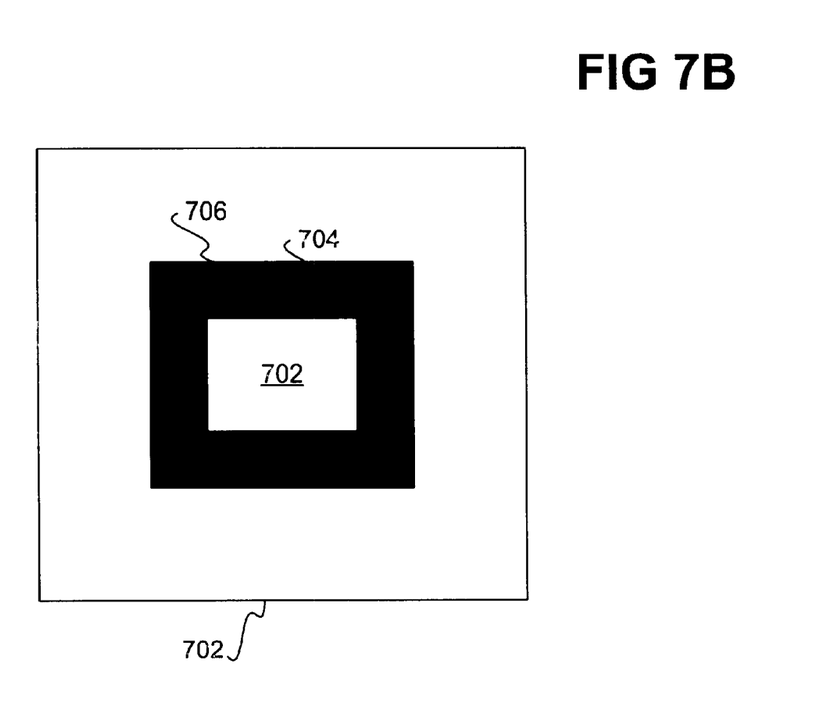

The manner by which the invention corrects misalignment of post-epi layers deposited is shown by reference to FIGS. 7A and 7B. The post-epi layers are also referred to as post-epi films. These layers or films may be from any of a variety of different materials, such as polysilicon, silicon dioxide, or oxide, silicon nitride, or nitride, and so on. It has been discovered that the first post-epi layer does not require correction; therefore, preferably, the invention performs correction only as to post-epi layers subsequent to the first post-epi layer. Unlike the epi layer itself, however, the post-epi layers typically experience a shift in both the x and y directions.

As shown in FIG. 7A, the alignment marks 704 are hidden from view by the first post-epi layer 702 deposited, and are indicated as such as dotted. To maintain the alignment marks 704, a photolithographic clear out process is performed, which clears the first post-epi layer 702, as well as possibly the epi layer itself, from around the alignment marks 704. The results of the clear out process are shown in FIG. 7B, where a window 706 has been created around the alignment marks 704, possibly exposing the underlying silicon wafer. FIG. 7B is particular to the clear out process being performed prior to the second post-epi layer being deposited. However, the process is the same for the other post-epi layers, such that all the previously deposited layers can be cleared out to maintain the alignment marks.

Figure 8A:
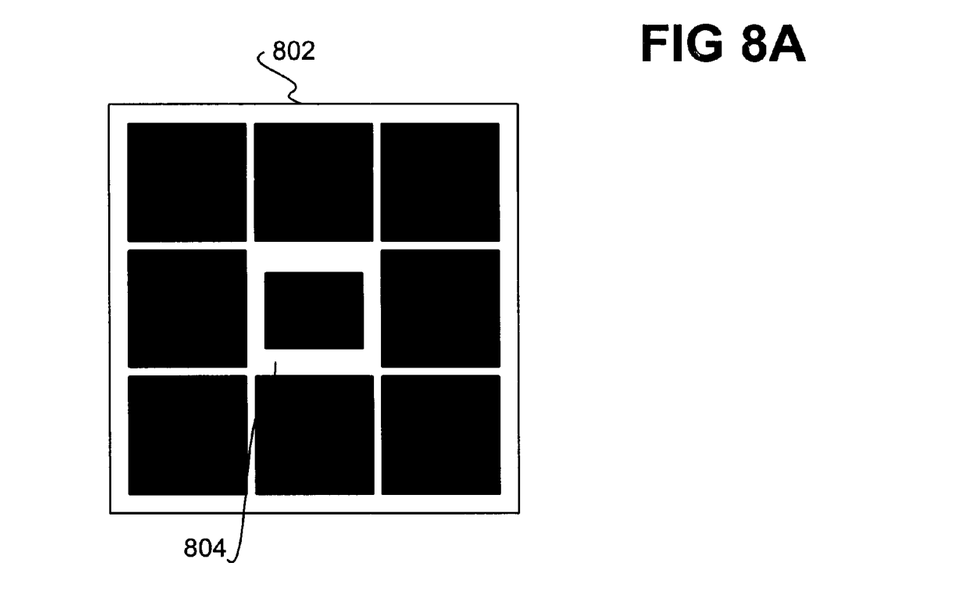
FIGS. 8A and 8B are diagrams showing how the clear out process can be performed to correct misalignment of deposited post-epi layers.
Figure 8B:
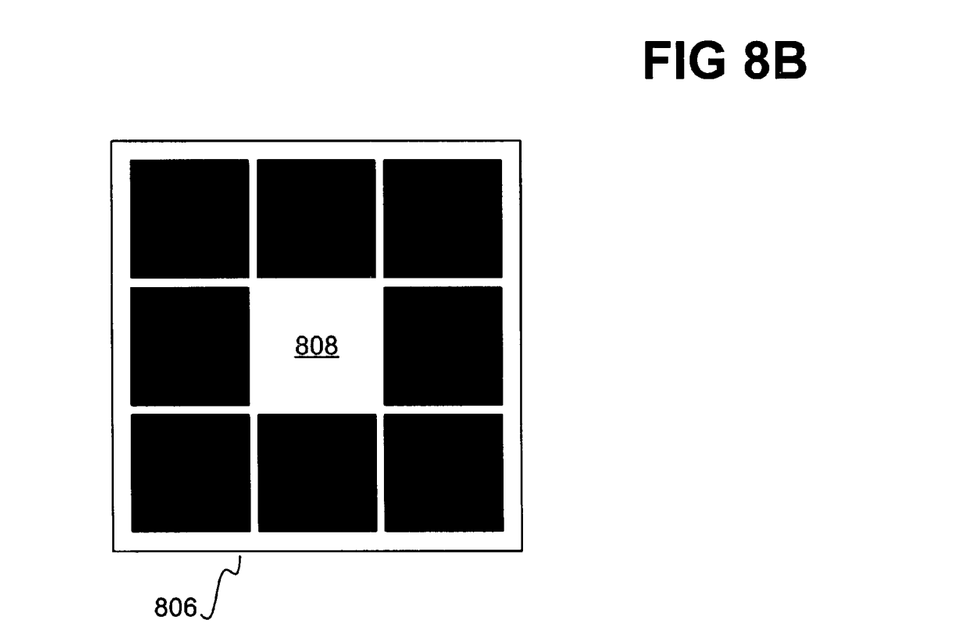

FIGS. 8A and 8B show how the clear out process can be performed. In FIG. 8A, a mask 802 is shown that contains an auxiliary pattern 802. The auxiliary pattern 802 contains no device circuitry, and surrounds a smaller pattern 805 in order to clear out a specified window area and isolate the smaller pattern 805. In this case, the auxiliary pattern 802 would correspond to the alignment marks 704 of FIG. 7B, such that a part of the epi layer 702 remains surrounded by the alignment marks 704 as shown in FIG. 7B. By comparison, in FIG. 8B, a mask 806 is shown that contains a blank pattern 808. The blank pattern 808 contains no circuitry, and clears out a specified window area, such that no part of the epi layer 702 of FIG. 7B would remain surrounded by the alignment marks 704 if the blank pattern 808 were used in lieu of the auxiliary pattern 802 of FIG. 8A.

Figure 9:
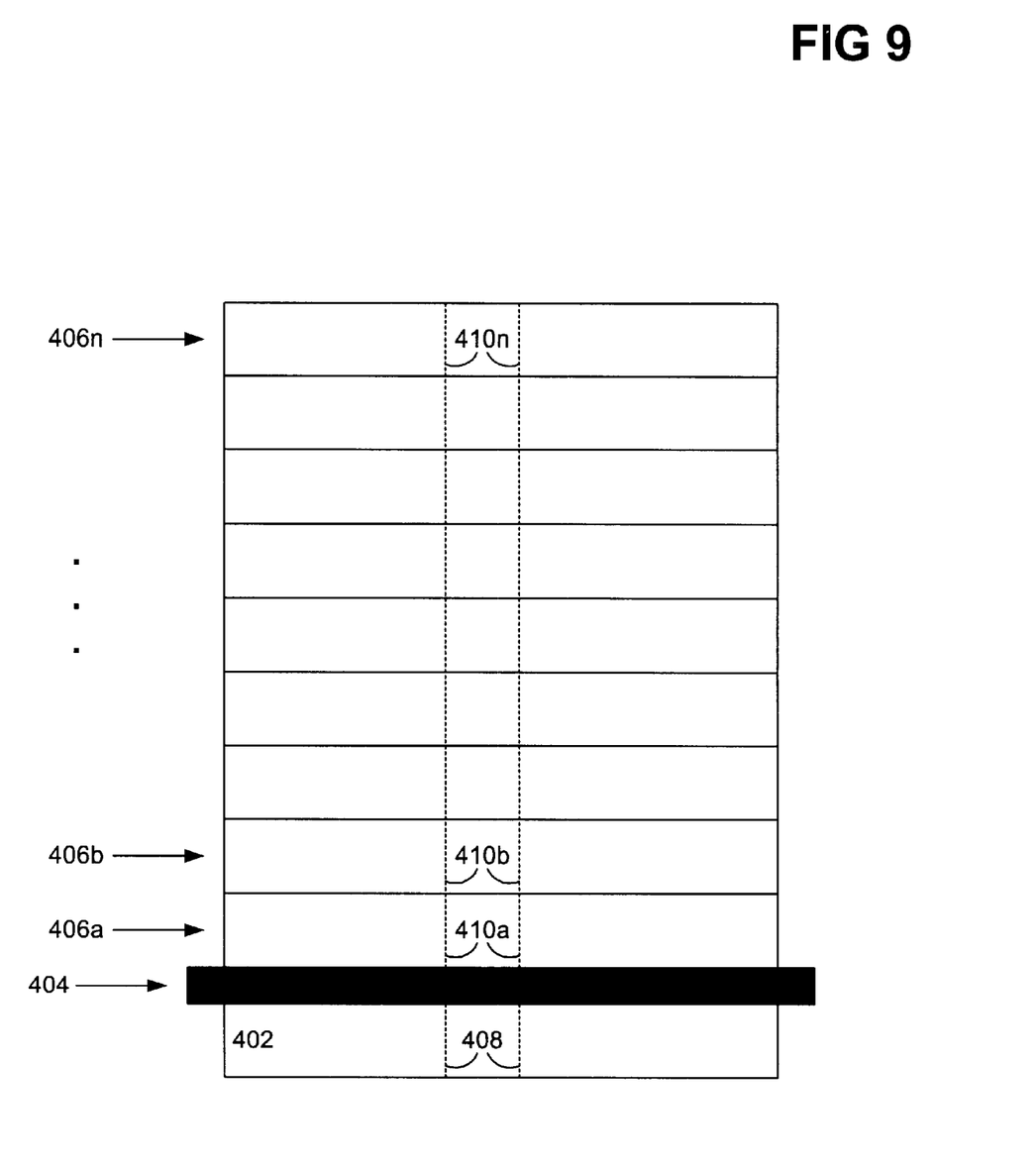
FIG. 9 is a diagram showing, in comparison to that of FIG. 4, how overlay shift is corrected by performing the invention.

By instead performing the overlay shift correction procedures of the invention, the semiconductor device of FIG. 4 would instead look like the device of FIG. 9. The semiconductor wafer 402 has alignment marks 408. The epitaxial silicon layer 404 is aligned thereupon, without any, or with minimal, overlay shift. Similarly, the post-epi layers 406a, 406b, . . . , 406n are deposited upon the epi layer 404, without any, or with minimal, overlay shift. This is indicated by the reference marks 410a, 410b, . . . , 410n aligning with the alignment marks 408 of the wafer 402.

Figure 10:
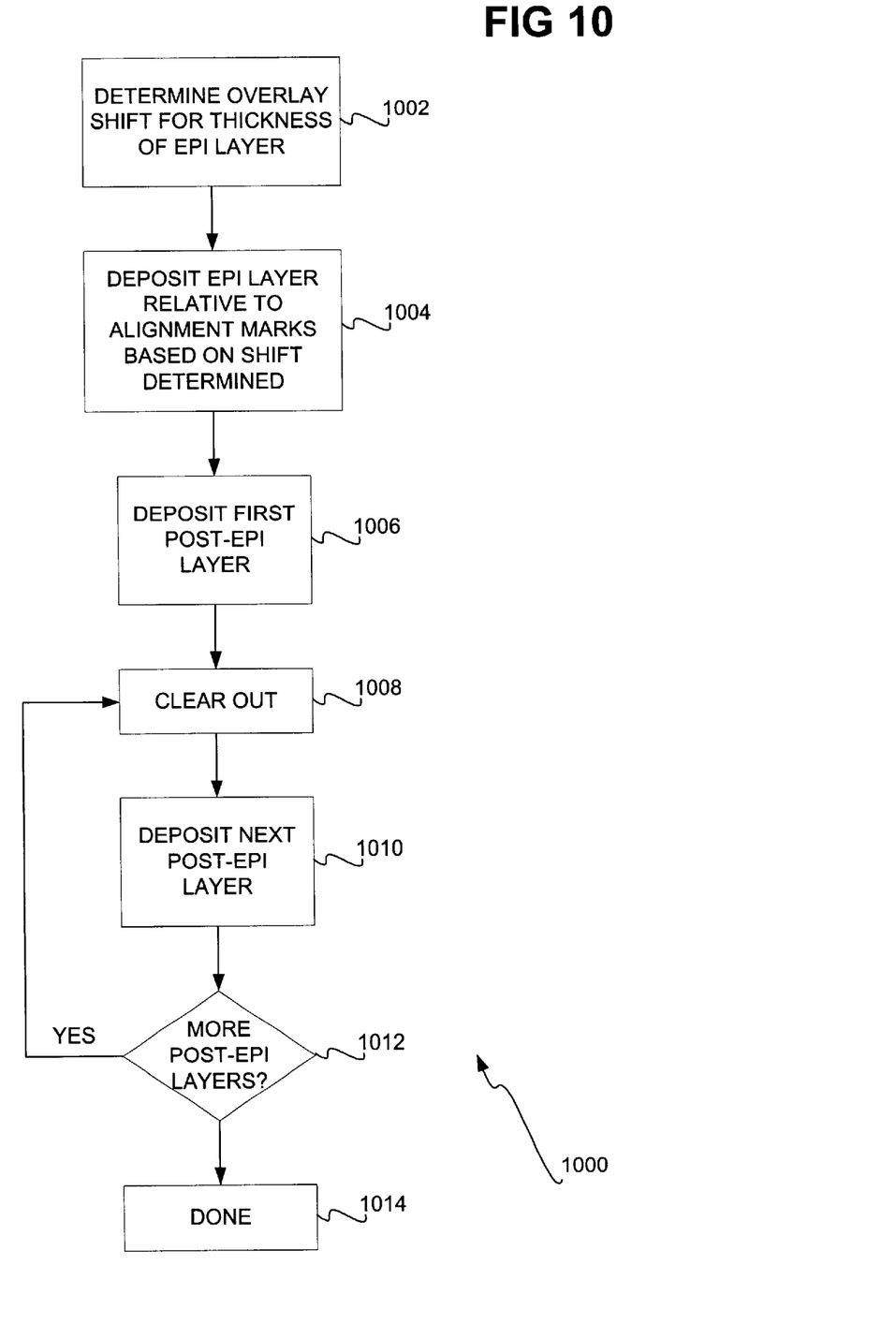
FIG. 10 is a flowchart of a method summarizing the procedures followed to prevent misalignment of the deposited epi layer and the post-epi layers.

FIG. 10 is a flowchart summarizing the overlay shift correction procedures of the invention. First, the overlay shift for the epi layer to be deposited is determined, based on the thickness of the epi layer (1002). The epi layer is deposited relative to the alignment marks on the semiconductor wafer, based on the shift that has been determined (1004). For instance, the zero mark coordinates, specifically the zero mark x coordinate, is shifted for the deposition of the epi layer, by the shift, or distance, that has been determined. The distance itself is based on, and preferably proportional to, the thickness of the epi layer to be deposited.

Because no overlay shift has been observed for the first post-epi layer, it is next deposited without any overlay shift correction (1006). However, alternatively, a clear out process can be performed prior to depositing the first post-epi layer. After the first post-epi layer is deposited, a clear out process is performed (1008) to maintain the wafer's alignment marks, and the next post-epi layer is deposited (1010). If there are more post-epi layers to be deposited (1012), the clear out (1008) and deposition (1010) processes are repeated. Otherwise, the shift correction procedures of the invention are done (1014).

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method comprising:

depositing an epitaxial silicon layer on a semiconductor wafer relative to alignment marks on the semiconductor wafer, the layer having a thickness, and preventing overlay shift of the epitaxial silicon layer by shifting the epitaxial silicon layer during deposition relative to the alignment marks on the semiconductor wafer based on the thickness of the epitaxial silicon layer; and, depositing one or more layers on the epitaxial silicon layer deposited on the semiconductor wafer.

2. The method of claim 1, wherein preventing the overlay shift of the epitaxial silicon layer comprises shifting zero mark coordinates relative to the alignment marks on the semiconductor wafer by a distance based on the thickness of the epitaxial silicon layer.

3. The method of claim 2, wherein the distance is proportional to the thickness of the epitaxial silicon layer.

4. The method of claim 1, wherein shifting the epitaxial silicon layer relative to the alignment marks on the semiconductor wafer comprises shifting the epitaxial silicon layer relative to the alignment marks by a distance proportional to the thickness of the epitaxial silicon layer.

5. The method of claim 1, wherein depositing the one or more layers on the epitaxial silicon layer comprises, prior to depositing each of at least one of the one or more layers, performing a clear out process to maintain the alignment marks on the semiconductor wafer.

6. The method of claim 1, wherein depositing the one or more layers on the epitaxial silicon layer comprises:

performing a clear out process relative to the epitaxial silicon layer; and, depositing a first layer of the one or more layers on the epitaxial silicon layer.

7. The method of claim 1, wherein depositing the one or more layers on the epitaxial silicon layer further comprises:

performing a clear out process relative to at least one of a first layer of the one or more layers and the epitaxial silicon layer; and, depositing a second layer of the one or more layers.

8. The method of claim 7, wherein depositing the one or more layers on the epitaxial silicon layer further comprises, prior to performing the clear out process, depositing the first layer of the one or more layers.

9. A method comprising:

depositing an epitaxial silicon layer on a semiconductor wafer relative to zero mark coordinates shifted relative to alignment marks on the semiconductor wafer by a distance based on a thickness of the epitaxial silicon layer;

depositing a first post-epi layer on the epitaxial silicon layer;

performing a clear out process relative to at least one of the first post-epi layer and the epitaxial silicon layer to maintain the alignment marks on the semiconductor; and, depositing a second post-epi layer on the epitaxial silicon layer.

10. The method of claim 9, wherein the distance is proportional to the thickness of the epitaxial silicon layer.

11. The method of claim 9, further comprising, prior to depositing the first post-epi layer on the epitaxial silicon layer, performing a clear out process relative to the epitaxial silicon layer to maintain the alignment marks on the semiconductor.

12. The method of claim 9, further comprising:

performing a clear out process relative to at least one of the first post-epi layer, the second post-epi layer, and the epitaxial silicon layer to maintain the alignment marks on the semiconductor; and, depositing a third post-epi layer on the second post-epi silicon layer.

13. The method of claim 12, further comprising:

performing a clear out process relative to at least one of the first post-epi layer, the second post-epi layer, the third post-epi layer, and the epitaxial silicon layer to maintain the alignment marks on the semiconductor; and, depositing a fourth post-epi layer on the third post-epi layer.

14. The method of claim 9, further comprising, for each layer of one or more additional layers to be deposited:

performing a clear out process relative to at least one of a plurality of prior layers to the layer to be deposited; and, depositing the layer to be deposited.

* * * * *